United States Patent
Djordjevic et al.

(10) Patent No.: US 8,184,993 B2
(45) Date of Patent: May 22, 2012

(54) POLARIZATION MODE DISPERSION (PMD) COMPENSATION IN POLARIZATION MULTIPLEXED CODED ORTHOGONAL FREQUENCY DIVISION MULTIPLEXING (OFDM) SYSTEMS

(75) Inventors: Ivan B. Djordjevic, Tucson, AZ (US); Lei Xu, Princeton, NJ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 735 days.

(21) Appl. No.: 12/392,317

(22) Filed: Feb. 25, 2009

(65) Prior Publication Data

US 2010/0215371 A1    Aug. 26, 2010

(51) Int. Cl.
*H04B 10/00* (2006.01)
(52) U.S. Cl. .................. 398/205; 398/202; 398/152
(58) Field of Classification Search .................. 398/202, 398/205, 152
See application file for complete search history.

(56) References Cited

U.S. PATENT DOCUMENTS

| | | | | |
|---|---|---|---|---|
| 7,133,550 | B2 * | 11/2006 | Hiroi et al. ................ | 382/145 |
| 7,502,421 | B2 * | 3/2009 | Hottinen et al. ............ | 375/267 |
| 7,693,429 | B1 * | 4/2010 | Lowery ...................... | 398/192 |
| 7,738,602 | B2 * | 6/2010 | Langenbach et al. ....... | 375/341 |
| 7,860,406 | B2 * | 12/2010 | Xie ............................. | 398/205 |
| 7,913,153 | B2 * | 3/2011 | Orio ........................... | 714/794 |
| 8,006,163 | B2 * | 8/2011 | Djordjevic et al. .......... | 714/758 |
| 2007/0002982 | A1 * | 1/2007 | Heikkila ..................... | 375/346 |
| 2007/0222654 | A1 * | 9/2007 | Vrazel et al. ................ | 341/144 |
| 2009/0177945 | A1 * | 7/2009 | Djordjevic et al. .......... | 714/758 |
| 2009/0225878 | A1 * | 9/2009 | Papadopoulos et al. ...... | 375/260 |
| 2010/0050048 | A1 * | 2/2010 | Djordjevic et al. ........... | 714/755 |
| 2010/0070828 | A1 * | 3/2010 | Murakami et al. ........... | 714/762 |
| 2010/0150258 | A1 * | 6/2010 | van Zelst .................... | 375/267 |
| 2010/0215371 | A1 * | 8/2010 | Djordevia et al. ........... | 398/79 |

OTHER PUBLICATIONS

Minkov, L.L., et al. Demonstration of PMD Compensation by LDPC-Coded Turbo Equalization and Channel Capacity Loss Characterization Due to PMD and Quantization. IEEE 2007. IEEE Photonics Technology Letters. vol. 19, No. 22. Nov. 2007. pp. 1852-1854.

Shieh, W., et al. Theoretical and Experimental Study on PMD-Supported Transmission Using Polarization Diversity in Coherent Optical OFDM Systems. Optics Express. Aug. 2007. vol. 15, No. 16. pp. 9936-9947.

Savory, S. Digital Filters for Coherent Optical Receivers. Optics Express. Jan. 2008. vol. 16, No. 2. pp. 804-817.

* cited by examiner

*Primary Examiner* — Agustin Bello
(74) *Attorney, Agent, or Firm* — James Bitetto; Joseph Kolodka

(57) ABSTRACT

A receiver and method are provided. The receiver includes a detector configured to receive polarization multiplexed coded orthogonal frequency division multiplexing input sequences and generate estimates of unknown transmitted symbols in the input sequences for x- and y-polarization channels with respect to laser phase noise and PMD. A demapper coupled to the detector is configured to partially cancel polarization mode dispersion (PMD) in the input sequences by computing symbol probabilities for the estimates with respect to the laser phase noise, and averaging the symbol probabilities with respect to the laser phase noise. One or more low-density parity-check (LDPC) decoders coupled to the demapper are configured to receive bit probabilities derived from the averaged symbol probabilities and output code words based at least on the bit probabilities. The one or more LDPC decoders iteratively provide extrinsic soft information feedback to the demapper to compensate for the PMD.

18 Claims, 5 Drawing Sheets

POLARIZATION MODE DISPERSION (PMD) COMPENSATION IN POLARIZATION MULTIPLEXED CODED ORTHOGONAL FREQUENCY DIVISION MULTIPLEXING (OFDM) SYSTEMS

BACKGROUND

1. Technical Field

The present invention relates to optical communications, and more particularly to polarization mode dispersion (PMD) compensation in polarization multiplexed coded OFDM systems.

2. Description of the Related Art

The performance of fiber-optic communication systems operating at high data rates is significantly degraded by the influence of intra-channel and inter-channel fiber nonlinearities, polarization mode dispersion (PMD), and chromatic dispersion.

In order to overcome those challenges, novel advanced techniques and devices in modulation and detection, coding and signal processing are of high importance. To deal with PMD, a number of methods have been proposed recently. While the proposed methods are capable of dealing with PMD to some extent, further improvement, for example, with respect to efficiency, is desirable.

SUMMARY

These and other drawbacks and disadvantages of the prior art are addressed by the present principles, which are directed to polarization mode dispersion (PMD) compensation in polarization multiplexed coded OFDM systems.

According to an aspect of the present principles, there is provided a receiver. The receiver includes a detector configured to receive polarization multiplexed coded orthogonal frequency division multiplexing (OFDM) input sequences and generate estimates of unknown transmitted symbols in the input sequences for x- and y-polarization channels with respect to laser phase noise and PMD. A demapper coupled to the detector is configured to partially cancel polarization mode dispersion (PMD) in the input sequences by computing symbol probabilities for the estimates with respect to the laser phase noise, and averaging the symbol probabilities with respect to the laser phase noise. One or more low-density parity-check (LDPC) decoders coupled to the demapper are configured to receive bit probabilities derived from the averaged symbol probabilities and output code words based at least on the bit probabilities. The one or more LDPC decoders iteratively provide extrinsic soft information feedback to the demapper to compensate for the PMD.

According to another aspect of the present principles, a method is provided. The method includes receiving and demultiplexing polarization multiplexed coded orthogonal frequency division multiplexing (OFDM) input sequences using a demultiplexer. Estimates of unknown transmitted symbols in the input sequences are generated for x- and y-polarization channels with respect to laser phase noise and PMD. Polarization mode dispersion (PMD) in the input sequences is partially cancelled using a demapper, by computing symbol probabilities for the estimates with respect to the laser phase noise, and averaging the symbol probabilities with respect to the laser phase noise. Bit probabilities derived from the averaged symbol probabilities are decoded using one or more low-density parity-check (LDPC) decoders coupled to the demapper to output code words based at least on the bit probabilities. Extrinsic soft information is iteratively fed back to the demapper to compensate for the PMD.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
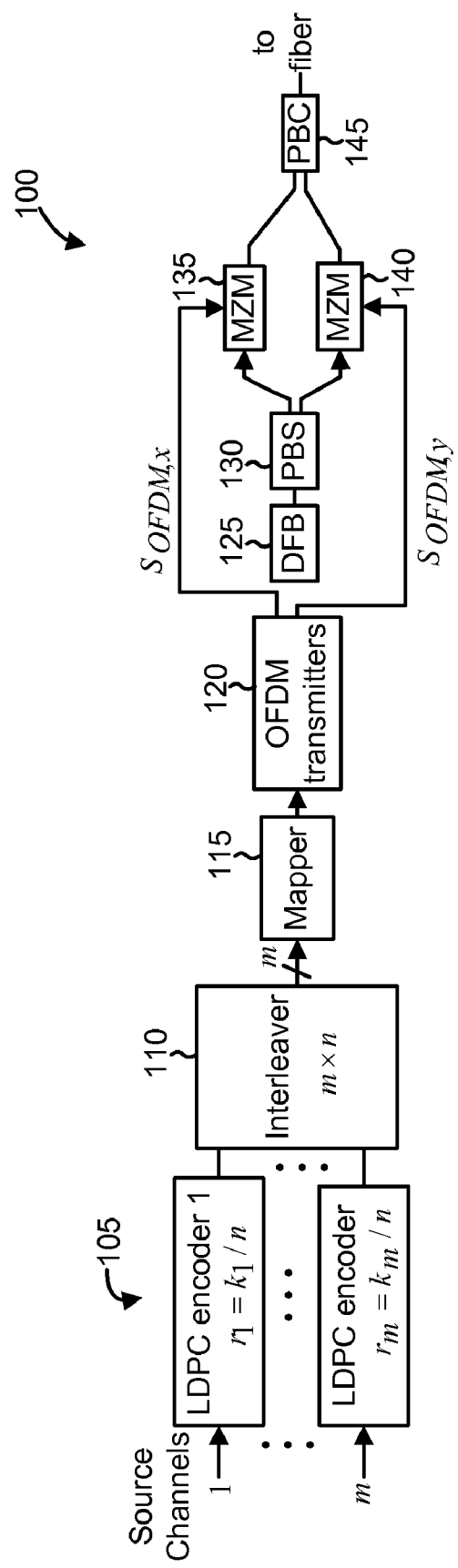
FIG. 1 is a block diagram showing a transmitter in accordance with an embodiment of the present principles.

Referring now in detail to the figures in which like numerals represent the same or similar elements and initially to FIG. 1, a transmitter 100 in accordance with an embodiment of the present principles is shown. The transmitter 100 includes a series (1 through m) of low-density parity-check (LDPC) encoders 105, an interleaver 110, a mapper 115, orthogonal frequency division multiplexing (OFDM) transmitters 120, a distributed feedback (DFB) laser 125, a polarizing beam splitter (PBS) 130, a first Mach-Zehnder modulator (MZM) or equivalent intensity modulator 135, a second Mach-Zehnder modulator (MZM) or equivalent intensity modulator 140, and a polarization beam combiner (PBC) 145.

Figure 2:
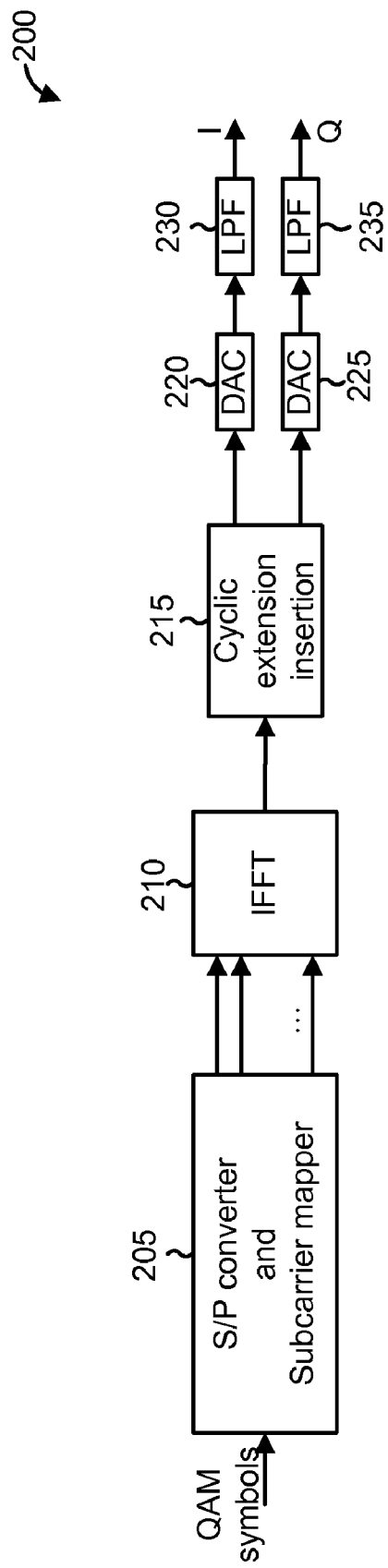
FIG. 2 is a block diagram showing an OFDM transmitter in accordance with an embodiment of the present principles.

FIG. 2 shows an OFDM transmitter 200 in accordance with an embodiment of the present principles. The OFDM transmitter 200 includes a serial to parallel (S/P) converter and subcarrier mapper 205, an inverse fast Fourier transform (IFFT) module 210, a cyclic extension insertion module 215, a first digital to analog converter (DAC) 220, a second DAC 225, a first low pass filter (LPF) 230, and a second LPF 235.

Figure 3:
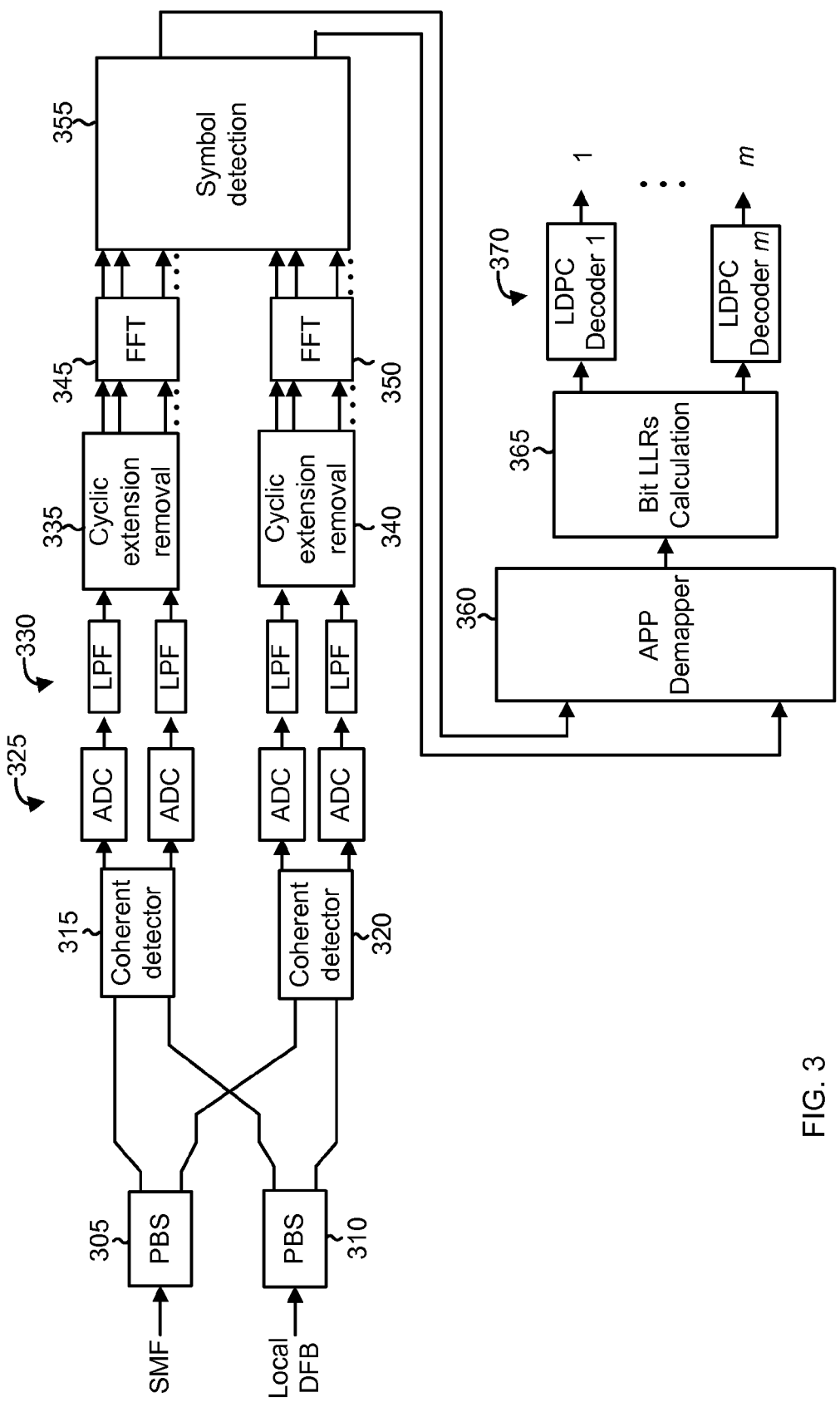
FIG. 3 is a block diagram showing a receiver in accordance with an embodiment of the present principles.

FIG. 3 shows a receiver 300 in accordance with an embodiment of the present principles. The receiver 300 includes a first polarizing beam splitter (PBS) 305, a second PBS 310, a first coherent detector 315, a second coherent detector 320, a series of analog to digital converters 325, a series of low pass filters 330, a first cyclic extension removal module 335, a second cyclic extension removal module 340, a first Fast Fourier Transform (FFT) 345, a second FFT 350, a symbol detector 355, an a posteriori probability (APP) demapper 360, a bit log-likelihood ratio (LLR) calculation module 365, and a series (1 through m) of LDPC decoders 370.

Figure 4:
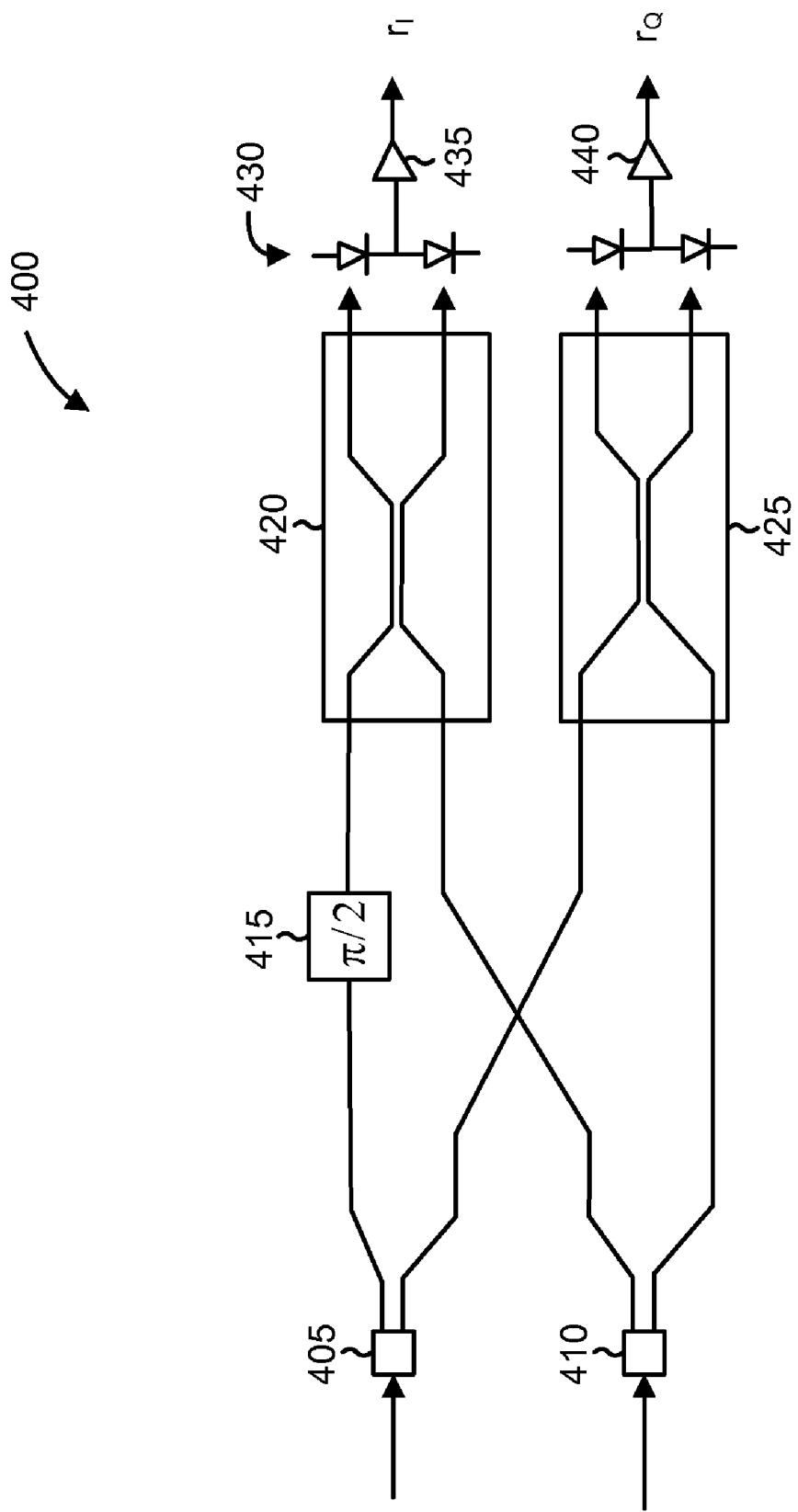
FIG. 4 is a block diagram showing a balanced coherent detector in accordance with an embodiment of the present principles.

FIG. 4 shows a balanced coherent detector 400 in accordance with an embodiment of the present principles. The coherent detector 400 includes a first 3 dB coupler 405, a second 3 dB coupler 410, a phase shifter ($\pi/2$) 415, an upper directional coupler 420, a lower directional coupler 425, a series of photo detectors 430, a trans impedance amplifier 435, and a trans impedance amplifier 440.

Elements of the transmitter 100, OFDM transmitter 200, receiver 300, and balanced coherent detector 400 are described in further detail herein after with respect to various aspects of the present principles.

Figure 5:
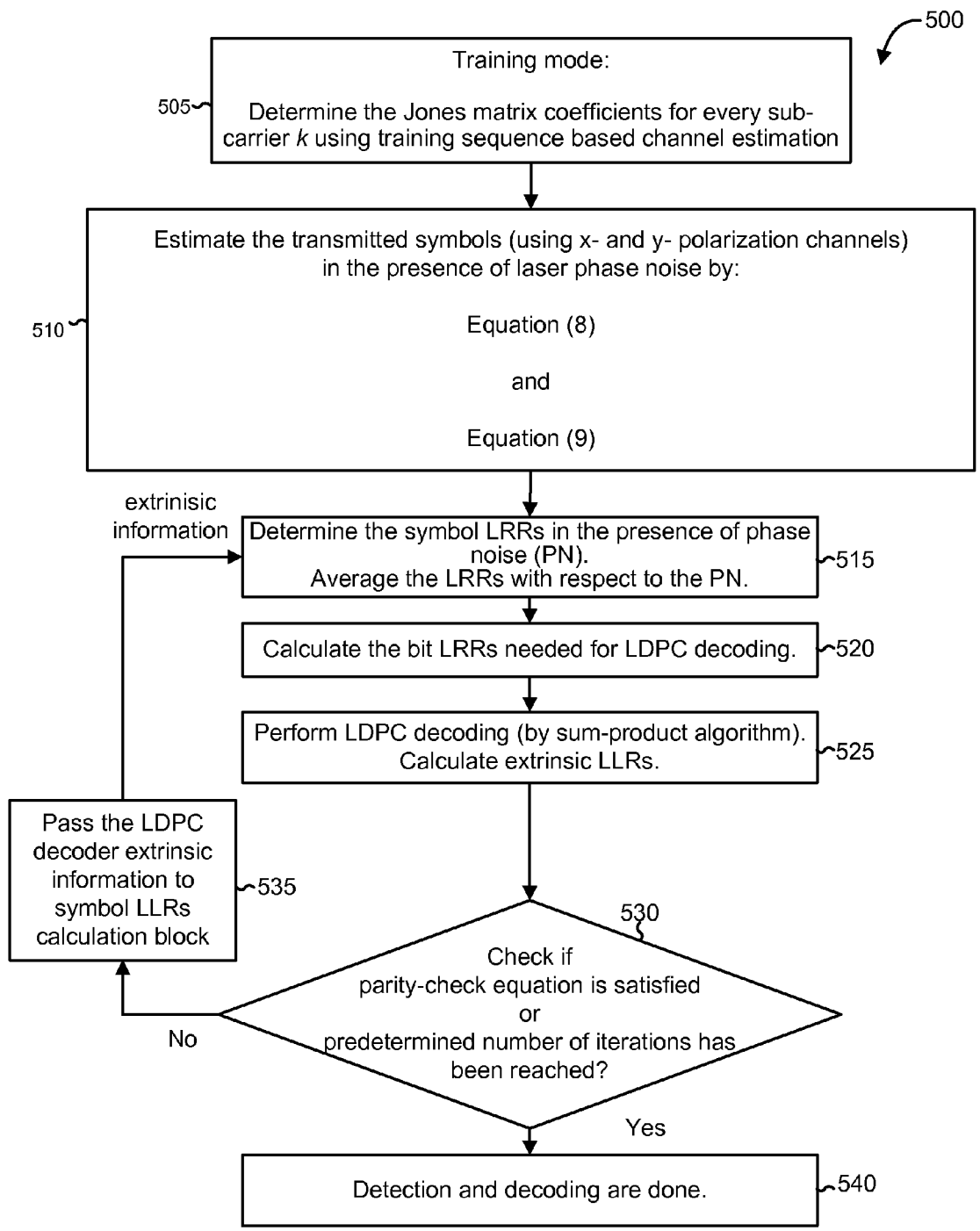
FIG. 5 is a flow diagram showing a method for PMD compensation in polarization multiplexed coded OFDM systems with coherent detection in accordance with an embodiment of the present principles.

FIG. 5 shows a method for PMD compensation in polarization multiplexed coded OFDM systems with coherent detection.

At step 505, which corresponds to a training mode, the Jones matrix coefficients are determined for every sub-carrier k by using training sequence based channel estimation.

At step 510, transmitted symbols are estimated using x- and y-polarization channels in the presence of laser phase noise based on the following:

$$\tilde{s}_{x,i,k} = \frac{\frac{h^*_{xx}}{|h_{xx}|^2}\left[r_{x,i,k} - \frac{h_{xy}h^*_{yy}}{|h_{yy}|^2}r_{y,i,k}\right]}{1 - \frac{h^*_{xx}h_{xy}h_{yx}h^*_{yy}}{|h_{xx}|^2|h_{yy}|^2}},$$

$$\tilde{s}_{y,i,k} = \frac{h^*_{yy}}{|h_{yy}|^2}r_{y,i,k} - \frac{h_{yx}h^*_{yy}}{|h_{yy}|^2}\tilde{s}_{x,i,k}.$$

At step 515, symbol LLRs are determined in the presence of phase noise (PN) by the APP demapper 360, and the symbol LRRs are averaged with respect to the PN.

At step 520, the bit LLRs needed for LDPC decoding are calculated by the bit LLRs calculation module 365.

At step 525, LDPC decoding is performed by the series of LDPC decoders 370 using, for example, a sum-product algorithm, and extrinsic LLRs are calculated.

At step 530, it is determined whether or not a parity-check equation has been satisfied or whether a predetermined number of iterations has been reached.

If so, then at step 540 detection and decoding are concluded. Otherwise, control is passed to step 535.

At step 535, the LDPC decoder extrinsic information (e.g., extrinsic LLRs) are passed to a symbol LLRs calculation module included in the APP demapper 360.

Steps of the method 500 are described in further detail herein after with respect to various aspects of the present principles.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

We present a PMD compensation scheme based on polarization multiplexed coded-OFDM with coherent detection. The spectral efficiency of the proposed scheme is twice higher than that of a prior art polarization diversity OFDM scheme. We show that the proposed scheme is able to compensate even 1200 ps of differential group delay, for a system operating at an aggregate rate of 100 Gb/s, with negligible penalty.

To deal with PMD, the polarization diversity sends the same OFDM symbol twice using x- and y-polarizations. The proposed scheme solves the PMD problem while transmitting different OFDM symbols on different polarizations, therefore, increasing the spectral efficiency twice.

For coherent detection OFDM, the received symbol vector $r_{i,k}=[r_{x,i,k}\ r_{y,i,k}]^T$ at the ith OFDM symbol and the kth subcarrier can be represented by the following:

$$r_{i,k} = H(k)s_{i,k}e^{j\phi_{PN}} + n_{i,k}, \quad (1)$$

where $s_{i,k}=[s_{x,i,k}\ s_{y,i,k}]^T$ denotes the transmitted symbol vector, $n_{i,k}=[n_{x,i,k}\ n_{y,i,k}]^T$ denotes the noise vector due to the amplified spontaneous emission (ASE), and the Jones matrix H(k) is defined by the following:

$$H(k) = H(\omega_k) = \begin{bmatrix} h_{xx}(k) & h_{xy}(k) \\ h_{yx}(k) & h_{yy}(k) \end{bmatrix} = R^{-1}P(\omega_k)R, \quad (2)$$

$$P(\omega_k) = \begin{bmatrix} e^{-j\omega_k\tau/2} & 0 \\ 0 & e^{j\omega_k\tau/2} \end{bmatrix},$$

where τ denotes DGD, and R=R(θ, ε) is the rotational matrix defined by the following:

$$R = \begin{bmatrix} \cos\left(\frac{\theta}{2}\right)e^{j\varepsilon/2} & \sin\left(\frac{\theta}{2}\right)e^{-j\varepsilon/2} \\ -\sin\left(\frac{\theta}{2}\right)e^{j\varepsilon/2} & \cos\left(\frac{\theta}{2}\right)e^{-j\varepsilon/2} \end{bmatrix}, \quad (3)$$

where θ denotes the polar angle, ε denotes the azimuth angle, and $\omega_k$ is the kth subcarrier frequency.

Here we use index k to denote the kth subcarrier frequency $\omega_k$. $\phi_{PN}$ denotes the phase noise process $\phi_{PN}=\phi_T-\phi_{LO}$ due to the laser phase noise processes of the transmitting laser $\phi_T$ and the local laser $\phi_{LO}$ that are commonly modeled as the Wiener-Levy processes, which are a zero-mean Gaussian processes with corresponding variances being $2\pi\Delta v_T|t|$ and $2\pi\Delta v_{LO}|t|$, where $\Delta v_T$ and $\Delta v_{LO}$ are the laser line widths of the transmitting laser and the receiving laser, respectively. The transmitted/received symbols per subcarrier are complex-valued, with the real part corresponding to the in-phase coordinate and the imaginary part corresponding to the quadrature coordinate of a corresponding signal constellation point.

Referring back to FIGS. 1-4, the proposed coded-OFDM scheme, with a low density parity check (LDPC) code as a channel code, is shown. The bit streams originating from m different information sources are encoded using different (n, $k_i$) LDPC codes of code rate $r_i=k_i/n$ where $k_i$ denotes the number of information bits of the ith (i=1, 2, . . . , m) component LDPC code, and n denotes the codeword length, which is the same for all LDPC codes. The use of different LDPC codes allows us to optimally allocate the code rates. If all component LDPC codes are identical, then the corresponding scheme is commonly referred to as bit-interleaved coded modulation (BICM). The outputs of the m LDPC encoders 105 are written row-wise into the block-interleaver 110. The mapper 115 accepts m bits at time instance i from the (m×n) interleaver 110 column-wise and determines the corresponding M-ary (M=$2^m$) signal constellation point ($\phi_{I,i}$, $\phi_{Q,i}$) in a two dimensional (2D) constellation diagram such as M-ary PSK or M-ary QAM. The coordinates correspond to in-phase and quadrature components of M-ary 2D constellation. The OFDM symbol is generated as described below. $N_{QAM}$ input QAM symbols are zero-padded to obtain $N_{FFT}$ input samples for inverse FFT (IFFT) (the zeros are inserted in the middle rather than at the edges), and $N_G$ non-zero samples are inserted by the cyclic extension insertion module 215 to create the guard interval. For efficient chromatic dispersion and PMD compensation, the length of the cyclically extended guard interval should be longer than the total spread due to chromatic dispersion and the maximum value of DGD. The cyclic extension is obtained by repeating the last $N_G/2$ samples of the effective OFDM symbol part ($N_{FFT}$ samples) as a prefix, and repeating the first $N_G/2$ samples as a suffix. After digital to analog conversion by the digital to analog converts 220, the OFDM signal is converted into the optical domain using the dual-drive Mach-Zehnder modulator (MZM). Two MZMs 135 and 140 are needed, one for each polarization. The outputs of the MZMs 135 and 140 are combined using the polarization beam combiner (PBC) 145. The same DFB laser 125 is used as a CW source, with the x- and y-polarizations separated by the PBS 130. Given the fact that the complexity of the multilevel coding (MLC) scheme is high for high speed implementations, the BICM is adopted hereinafter.

Here we describe the operation of the symbol detector 355, the calculation of symbol log-likelihood ratios (LLRs) by the APP demapper 360, and the calculation of bit LLRs by the bit LLRs calculation module 365, in the presence of laser phase noise. By re-writing Equation (1) in scalar form, while ignoring the laser phase noise at the moment to keep the explanation simpler, we obtain the following:

$$r_{x,i,k} = h_{xx}(k)s_{x,i,k} + h_{xy}(k)s_{y,i,k} + n_{x,i,k}, \quad (4)$$

$$r_{y,i,k} = h_{yx}(k)s_{x,i,k} + h_{yy}(k)s_{y,i,k} + n_{y,i,k}, \quad (5)$$

where index k denotes the kth subcarrier, index i denotes the ith OFDM symbol, $h_{ij}(k)$ ($i,j \in \{x,y\}$) are the channel coefficients due to PMD introduced by Equation (2), $s_{x,i,k}$ and $s_{y,i,k}$ denote the transmitted symbols in x- and y-polarization, respectively, and corresponding received symbols are denoted by $r_{x,i,k}$ and $r_{y,i,k}$. In Equations (4)-(5), $n_{x,i,k}$ and $n_{y,i,k}$ denote the ASE noise processes in the x- and y-polarizations, respectively. In the absence of ASE noise, Equations (4) and (5) represent the system of linear equations with two unknowns $s_{x,i,k}$ and $s_{y,i,k}$. By multiplying Equation (4) $h_{xx}(k)/|h_{xx}(k)|^2$ and Equation (4) with $h_{yy}(k)/|h_{yy}(k)|^2$, the unknown transmitted symbols can be estimated by the following:

$$\tilde{s}_{x,i,k} = \frac{\frac{h_{xx}^*}{|h_{xx}|^2}\left[r_{x,i,k} - \frac{h_{xy}h_{yy}^*}{|h_{yy}|^2}r_{y,i,k}\right]}{1 - \frac{h_{xx}^*h_{xy}}{|h_{xx}|^2}\frac{h_{yx}h_{yy}^*}{|h_{yy}|^2}}, \quad (6)$$

$$\tilde{s}_{y,i,k} = \frac{h_{yy}^*}{|h_{yy}|^2}r_{y,i,k} - \frac{h_{yx}h_{yy}^*}{|h_{yy}|^2}\tilde{s}_{x,i,k}. \quad (7)$$

where $\tilde{s}_{x,i,k}$ and $\tilde{s}_{y,i,k}$ denote the detector estimates of symbols $s_{x,i,k}$ and $s_{y,i,k}$ transmitted on the kth subcarrier of the ith OFDM symbol. Notice that the OFDM scheme with polarization diversity, assuming that both polarizations are used on a transmitter side and equal-gain combining on a receiver side, is the special case of the symbol detector described by Equations (6)-(7). By setting $s_{x,i,k} = s_{y,i,k} = s_{i,k}$ and using the symmetry of channel coefficients, the transmitted symbol can be estimated by the following:

$$\tilde{s}_{i,k} = (h_{xx}^* r_{x,i,k} + h_{xy}^* r_{y,i,k})/(|h_{xx}|^2 + |h_{xy}|^2).$$

In the presence of laser phase noise, the symbols detector estimates are a function of the laser phase noise process as follows:

$$\tilde{s}_{x,i,k} = \frac{\frac{h_{xx}^*}{|h_{xx}|^2}e^{-j\phi_{PN}}\left[r_{x,i,k} - \frac{h_{xy}h_{yy}^*}{|h_{yy}|^2}r_{y,i,k}\right]}{1 - \frac{h_{xx}^*h_{xy}}{|h_{xx}|^2}\frac{h_{yx}k_{yy}^*}{|h_{yy}|^2}}, \quad (8)$$

$$\tilde{s}_{y,i,k} = \frac{h_{yy}^*e^{-j\phi_{PN}}}{|h_{yy}|^2}r_{y,i,k} - \frac{h_{yx}h_{yy}^*}{|h_{yy}|^2}\tilde{s}_{x,i,k}. \quad (9)$$

The detector soft estimates of symbols carried by the kth subcarrier in the ith OFDM symbol, $\tilde{s}_{x(y),i,k}$, are forwarded to the a posteriori probability (APP) demapper 360, which determines the symbol log-likelihood ratios (LLRS) $\lambda_{x(y)}(s)$ of x- (y-)polarization by the following:

$$\lambda_{x(y)}(s|\phi_{PN}) = -\frac{(\text{Re}[\tilde{s}_{x(y),i,k}(\phi_{PN})] - \text{Re}[QAM(\text{map}(s))])^2}{2\sigma^2} - \frac{(\text{Im}[\tilde{s}_{x(y),i,k}(\phi_{PN})] - \text{Im}[QAM(\text{map}(s))])^2}{2\sigma^2}; s = 0, 1, \ldots, 2^{n_b} - 1 \quad (10)$$

where Re[ ] and Im[ ] denote the real and imaginary part of a complex number, respectively, QAM denotes the QAM-constellation diagram, $\sigma^2$ denotes the variance of an equivalent Gaussian noise process originating from ASE noise, map(s) denotes a corresponding mapping rule (Gray mapping rule is applied here, and nb denotes the number of bits carried by a symbol. Notice that the symbol LLRs in Equation (10) are conditioned on the laser phase noise sample $\phi_{PN} = \phi_T - \phi_{LO}$, which is a zero-mean Gaussian process (tile Wiener-Levy process) with variance $\sigma^2_{PN} = 2\pi(\Delta\nu_T + \Delta\nu_{LO})|t|$ ($\Delta\nu_T$ and $\Delta\nu_{LO}$ are the corresponding laser line widths mentioned earlier). This comes from the fact that estimated symbols $\tilde{s}_{x(y)i,k}$ are functions of $\phi_{PN}$. To remove the dependence on $\phi_{PN}$, we have to average the likelihood function (not its logarithm), over all possible values of $\phi_{PN}$:

$$\lambda_{x(y)}(s) = \log\left\{\int_{-\infty}^{\infty}\exp[\lambda_{x(y)}(s|\phi_{PN})]\frac{1}{\sigma_{PN}\sqrt{2\pi}}\exp\left(-\frac{\phi_{PN}^2}{2\sigma_{PN}^2}\right)d\phi_{PN}\right\}. \quad (11)$$

The calculation of LLRs in Equation (11) can be performed by numerical integration. For the laser line widths considered herein, it is sufficient to use the trapezoidal rule, with samples of $\phi_{PN}$ obtained by pilot-aided channel estimation.

Let us denote by $b_{j,x(y)}$ the jth bit in an observed symbols binary representation $b=(b_1, b_2, \ldots, b_{nb})$ for x- (y-)polarization. The bit LLRs required for LDPC decoding are calculated from symbol LLRs by the following:

$$L(\hat{b}_{j,x(y)}) = \log\frac{\sum_{s:b_j=0}\exp[\lambda_{x(y)}(s)]}{\sum_{s:b_j=1}\exp[\lambda_{x(y)}(s)]}. \quad (12)$$

The jth bit LLR in Equation (12) is calculated as the logarithm of the ratio of a probability that $b_j=0$ and a probability that $b_j=1$. In the nominator, the summation is done over all symbols s having 0 at the position j. Similarly, in the denominator, summation is performed over all symbols s having 1 at the position j.

The LDPC decoders 370 employ the sum-product-with-correction term algorithm. The LDPC code used herein belong to the class of quasi-cyclic (array) codes of large girth ($g \geq 10$), so that the corresponding decoder complexity is low compared to random LDPC codes, and do not exhibit the error floor phenomena in the region of interest in fiber-optics communications ($\leq 10^{-15}$).

In contrast to the prior art PMD turbo equalization scheme, whose complexity grows exponentially as the DGD increases, the complexity of the proposed polarization interference cancellation schemes remains the same. The spectral efficiency of the proposed scheme is two times higher than that of prior art polarization diversity OFDM. The proposed scheme performs comparable to polarization diversity OFDM, but provides two time higher spectral efficiency. The proposed scheme is able to compensate even 1200 ps of differential group delay, for the system operating at an aggregate rate of 100 Gb/s, with negligible penalty. The proposed scheme is an interesting candidate for 100 Gb/s Ethernet. By using 32-QAM based polarization multiplexed coded-OFDM, we are able to achieve the aggregate rate of 100 Gb/s, while the OFDM signal bandwidth is only 10 GHz.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A receiver, comprising:
   a detector configured to receive polarization multiplexed coded orthogonal frequency division multiplexing (OFDM) input sequences and generate estimates of unknown transmitted symbols in the input sequences for x- and y-polarization channels with respect to laser phase noise and PMD;
   a demapper coupled to said detector, configured to partially cancel polarization mode dispersion (PMD) in the input sequences by computing symbol probabilities for the estimates with respect to the laser phase noise, and averaging the symbol probabilities with respect to the laser phase noise; and
   one or more low-density parity-check (LDPC) decoders coupled to said demapper, configured to receive bit probabilities derived from the averaged symbol probabilities and output code words based at least on the bit probabilities, the one or more LDPC decoders iteratively providing extrinsic soft information feedback to said demapper to compensate for the PMD.

2. The receiver of claim 1, wherein said detector module generates the estimates of the unknown transmitted symbols based on Jones matrix coefficients determined with respect to a training based channel estimation.

3. The receiver of claim 1, wherein said detector performs equal-gain combining on the input sequences to generate the estimates of the unknown transmitted symbols in the input sequences.

4. The receiver of claim 1, wherein the input sequences comprise different OFDM symbols on different ones of the x- and y-polarizations.

5. The receiver of claim 1, wherein said detector utilizes a symmetry of channel coefficients to generate the estimates of the unknown transmitted symbols in the input sequences.

6. The receiver of claim 1, wherein the laser phase noise is determined at least using pilot-aided channel estimation.

7. The receiver of claim 1, wherein said demapper averages the symbol probabilities with respect to the laser phase noise over all values of a plurality of laser phase noise samples, so as to remove a dependence of the symbol estimates on the laser phase noise.

8. The receiver of claim 1, wherein said demapper is an a posteriori probability (APP) demapper.

9. The receiver of claim 1, wherein the laser phase noise is represented by a zero-mean Gaussian process with variance, the variance based on laser line widths of a transmitting laser and a receiver laser.

10. A method, comprising:
    receiving and demultiplexing polarization multiplexed coded orthogonal frequency division multiplexing (OFDM) input sequences using a demultiplexer;
    generating estimates of unknown transmitted symbols in the input sequences for x- and y-polarization channels with respect to laser phase noise and PMD;
    partially cancelling polarization mode dispersion (PMD) in the input sequences using a demapper, by computing symbol probabilities for the estimates with respect to the laser phase noise, and averaging the symbol probabilities with respect to the laser phase noise;
    decoding bit probabilities derived from the averaged symbol probabilities using one or more low-density parity-check (LDPC) decoders coupled to said demapper to output code words based at least on the bit probabilities; and
    iteratively feeding back extrinsic soft information to the demapper to compensate for the PMD.

11. The method of claim 10, wherein said generating step generates the estimates of the unknown transmitted symbols based on Jones matrix coefficients determined with respect to a training based channel estimation.

12. The method of claim 10, wherein said generating step comprises performing equal-gain combining on the input sequences to generate the estimates of the unknown transmitted symbols in the input sequences.

13. The method of claim 10, wherein the input sequences comprise different OFDM symbols on different ones of the x- and y-polarizations.

14. The method of claim 10, wherein said generating step comprises utilizing a symmetry of channel coefficients to generate the estimates of the unknown transmitted symbols in the input sequences.

15. The method of claim 10, wherein the laser phase noise is determined at least using pilot-aided channel estimation.

16. The method of claim 10, wherein said averaging step averages the symbol probabilities with respect to the laser phase noise over all values of a plurality of laser phase noise samples, so as to remove a dependence of the symbol estimates on the laser phase noise.

17. The method of claim 10, the demapper is an a posteriori probability (APP) demapper.

18. The method of claim 10, wherein the laser phase noise is represented by a zero-mean Gaussian process with variance, the variance based on laser line widths of a transmitting laser and a receiver laser.

* * * * *